United States Patent [19]
Suyama et al.

[11] Patent Number: 6,055,255
[45] Date of Patent: Apr. 25, 2000

[54] SEMICONDUCTOR LASER DEVICE AND METHOD FOR PRODUCING THE SAME

[75] Inventors: Takahiro Suyama, Yamatokoriyama; Ken Ohbayashi, Nara-ken; Mitsuhiro Matsumoto, Kashihara, all of Japan

[73] Assignee: Sharp Kabushiki Kaisha, Osaka, Japan

[21] Appl. No.: 08/790,815

[22] Filed: Jan. 30, 1997

[30] Foreign Application Priority Data

Feb. 1, 1996 [JP] Japan ................................. 8-016931

[51] Int. Cl.⁷ ..................................................... H01S 3/19
[52] U.S. Cl. .............................................. 372/46; 372/45
[58] Field of Search ........................................ 372/46, 45

[56] References Cited

U.S. PATENT DOCUMENTS 4,961,197 10/1990 Tanaka et al. ............................ 372/45
5,136,601 8/1992 Kajimura et al. ........................ 372/46

FOREIGN PATENT DOCUMENTS 7-193316 7/1995 Japan .

OTHER PUBLICATIONS

Yamada, "A theoretical analysis of self–sustained pulsation phenomena in narrow–stripe semiconductor lasers" *IEEE Journal of Quantum Electronics* (May 1993) 29(5):1330–1336.

Takayama et al., "800m V peak power self–sustained pulsation GaAlAs lasrer diodes" *14th IEEE International Semiconductor Laser Conference* (Sep. 19–23, 1994) pp. 247–248.

Hayashi et al., "Low noise and high output–power infrared semiconductor laser having saturable absorbing layer" *Proceedings of the 12th Semiconductor Laser Symposium* (Mar. 3, 1995) p. 11. A partial English translation is included herewith.

*Primary Examiner*—Rodney Bovernick
*Assistant Examiner*—Quyen P. Leung
*Attorney, Agent, or Firm*—Morrison & Foerster LLP

[57] ABSTRACT

A semiconductor laser device includes: a semiconductor substrate of a first conductivity type; a layered structure including at least a first cladding layer of the first conductivity type, an active layer, and a second cladding layer of a second conductivity type. The layered structure is provided on the semiconductor substrate. The semiconductor laser device also includes: a current blocking structure, having a striped concave portion therein, formed on the layered structure; and a third cladding layer of the second conductivity type provided so as to cover the striped concave portion and the current blocking structure. The current blocking structure includes at least a saturable absorbing layer having a forbidden band width which is substantially equal to a forbidden band width of the active layer.

5 Claims, 12 Drawing Sheets

SEMICONDUCTOR LASER DEVICE AND METHOD FOR PRODUCING THE SAME

BACKGROUND OF THE INVENTION

1. Field of the Invention

The present invention relates to a high output-power semiconductor laser device having a sufficiently low noise characteristic and having sufficiently high resistance to the returning light of an emitted laser beam. The laser device is applicable as a light source for a recording/reproducing type magneto-optical disk or the like. More particularly, the present invention relates to a high output-power semiconductor laser device which utilizes a saturable absorber to induce a self-sustained pulsation phenomenon for obtaining a sufficiently low noise characteristic, and a method for producing the same.

2. Description of the Related Art

A semiconductor laser device can be used as a light source, incorporated in an optical disk apparatus, for reading signals. In such an optical disk apparatus, the emitted laser beam from the semiconductor laser device may be reflected on a plane of the disk back into the semiconductor laser device. In such a case, the semiconductor laser device tends to experience an extremely large amount of noise (i.e., a so-called "noise by returning light") resulting in an incorrect reading of the signals from the optical disk.

In order to minimize the noise by returning light of the semiconductor laser device, a self-sustained pulsation phenomenon is commonly used. In a self-sustained pulsation type semiconductor laser device utilizing the self-sustained pulsation phenomenon, the coherency of the laser beam is decreased by a self-sustained pulsation. Therefore, even when the laser beam is reflected from the plane of the disk back into the semiconductor laser device, no interference is generated inside the semiconductor laser device. As a result, a substantially low noise characteristic of the semiconductor laser device is ensured. In theory, the self-sustained pulsation is induced by providing a saturable absorber in an active layer of the semiconductor laser device (M. Yamada: IEEE J. Quantum Electron., vol. QE-29, No. 5 (May, 1993), pp. 1330–1336).

FIG. 12 is a cross-sectional view showing a conventional semiconductor laser device 50 in which a low-noise operation is achieved by self-sustained pulsation (see the proceedings of the 14th IEEE International Semiconductor Laser Conference, Th4.1 (1994), pp. 247–248).

In this conventional laser device 50, an n-GaAs buffer layer 52, an n-al$_x$Ga$_{1-x}$As (x=0.4) first cladding layer 53, an undoped multiple quantum well active layer 54 (hereinafter, simply referred to as an "MQW active layer"), a p-al$_x$Ga$_{1-x}$As (x=0.4) second cladding layer 55 and an n-Al$_x$Ga$_{1-x}$As (x=0.45) current blocking layer 56 are sequentially grown on an n-GaAs substrate 51 in a wafer state by a metal organic chemical vapor deposition method (hereinafter, simply referred to as an "MOCVD method"). Thereafter, the wafer is taken out from the MOCVD apparatus. A striped groove 57 (hereinafter, simply referred to as a "striped concave portion 57") is formed in the current blocking layer 56 such that the surface of the second cladding layer 55 is exposed. The striped concave portion 57 acts as a current path when the semiconductor laser device 50 operates.

Thereafter, the wafer is again placed in the MOCVD apparatus. A p-Al$_x$Ga$_{1-x}$As (x=0.4) third cladding layer 58 and a p-GaAs cap layer 59 are sequentially grown by the MOCVD method on the wafer so as to cover the current blocking layer 56 and the striped concave portion 57. After the third cladding layer 58 and the cap layer 59 have been grown, a p-side electrode 60 is formed on an upper surface of the cap layer 59 and an n-side electrode 61 is formed on a bottom surface of the substrate 51. The resulting wafer is then divided into a plurality of chips to obtain individual semiconductor laser devices 50.

Furthermore, in order to obtain a high output-power semiconductor laser device, the light emitting end facet is coated such that a reflectivity thereof is approximately 3%, and the other end facet is coated such that a reflectively thereof is approximately 94%.

When a voltage is applied between the electrodes 60 and 61 of the resulting semiconductor laser device 50, a current is injected into the active layer 54 via the striped concave portion 57, thereby generating laser oscillation. The oscillated laser beam is guided in the region immediately under the striped concave portion 57 due to the difference in the effective refractive index between the portion inside the striped concave portion 57 and the portions outside the striped concave portion 57.

In the conventional semiconductor laser device 50, when the thickness of the second cladding layer 55 is increased to a predetermined amount, and at the same time, the difference in the effective refractive index between the portion in the striped concave portion 57 and the portions outside the striped concave portion 57 is made substantially small, the light is not sufficiently confined in the striped concave portion 57. As a result, the width of the spread laser beam becomes wider than the width of the current injected region of the active layer 54. In such a state, portions of the active layer 54, corresponding to the outside of the striped concave portion 57, act as saturable absorbers for a self-sustained pulsation.

FIG. 13 is a cross-sectional view showing another type of conventional semiconductor laser device 70 in which a low-noise operation is realized by a self-sustained pulsation phenomenon. The semiconductor laser device 70 includes a saturable absorbing layer 76 separate from an active layer 74. A self-sustained pulsation is generated by a saturable absorbing function of the saturable absorbing layer 76 (see the proceedings of 12th Semiconductor Laser Symposium, March, 1995, p. 11).

Specifically, the semiconductor laser device 70 includes an n-GaAs buffer layer 72, an n-Al$_y$Ga$_{1-y}$As first cladding layer 73, an Al$_x$Ga$_{1-x}$As active layer 74 and a p-Al$_y$Ga$_{1-y}$As second cladding layer 75 sequentially provided on an n-GaAs substrate 71. A striped p-AlGaAs saturable absorbing layer 76 is provided on the second cladding layer 75.

A striped mesa region 79, including a p-Al$_y$Ga$_{1-y}$As third cladding layer 77 and a p-GaAs contact layer 78, is formed on the p-AlGaAs saturable absorbing layer 76. Furthermore, an n-AlGaAs current blocking layer 80 is provided on the second cladding layer 75 so as to sandwich the mesa region 79. A p-GaAs cap layer 81 is further provided over the striped mesa region 79 and the current blocking layer 80. A p-side electrode 82 is formed on an upper surface of the cap layer 81 and an n-side electrode 83 is formed on a bottom surface of the substrate 71.

In the case of the conventional semiconductor laser device 70, an Al mole fraction of the saturable absorbing layer 76 (i.e., a forbidden band width of the saturable absorbing layer 76) is made substantially equal to an Al mole fraction of the active layer 74 (i.e., a forbidden band width of the active layer 74), thereby ensuring the saturable absorbing characteristic of the device.

In the previously described semiconductor laser device 50, the portions of the active layer 54 corresponding to the outside of the striped concave portion 57 act as the saturable absorbers. In the semiconductor laser device 70, the saturable absorbing characteristic of the saturable absorbing layer 76, which is separately provided from the active layer 74, is used for the self-sustained pulsation.

In the semiconductor laser device 50, a sufficient saturable absorbing effect is required in order to realize a sufficiently strong self-sustained pulsation (i.e., a sufficiently low coherency). The following two techniques are available for this purpose.

(1) Increasing the amount of light that leaks into the saturable absorbers (i.e., the portions of the active layer 54 corresponding to the outside of the striped concave portion 57) by making the difference in the effective refractive index between the inside and the outside of the striped concave portion 57 sufficiently small; or (2) Increasing the volume of each of the saturable absorbers by making the active layer 54 sufficiently thick.

However, the above-mentioned techniques (1) and (2) have the following drawbacks.

According to technique (1), the size of a light beam spot becomes wide as the amount of light that leaks into the saturable absorbers increases. Therefore, the radiation angle of the emitted laser beam with respect to a direction parallel to the active layer 54 becomes small. As a result, an undesirable change in the coupling efficiency of the semiconductor laser device 50 and a lens occurs upon comparison with the coupling efficiency obtained in the case of a semiconductor laser device with no self-sustained pulsation characteristic.

According to technique (2), the reliability of the semiconductor laser device in a high output-power condition generally deteriorates when the active layer 54 is made substantially thick.

In the case of the conventional semiconductor laser device 70, instead of using the active layer 74 provided outside the striped mesa region 79, the saturable absorbing layer 76 in the mesa region 79, provided separately from the active layer 74, is utilized for the self-sustained pulsation. Therefore, there is no need to expand the size of the light beam spot by increasing the amount of light that leaks into the active layer 74 provided outside the striped concave portion 79. Thus, in the semiconductor laser device 70, the aforementioned problem caused in the semiconductor laser device 50 does not occur.

However, in order to ensure a sufficiently strong self-sustained pulsation characteristic for a sufficiently low noise characteristic, the saturable absorbing layer 76 needs to be relatively thick. Since the saturable absorbing layer 76 is formed in the vicinity of the center portion of the oscillation region, a large amount of light is absorbed by the saturable absorbing layer 76 in an unsaturated state. Therefore, the operation current increases due to an increase in the oscillation starting current and deterioration of derivative efficiency. As a result, the operation characteristic of the semiconductor laser device 70 is deteriorated.

SUMMARY OF THE INVENTION

A semiconductor laser device of the invention includes: a semiconductor substrate of a first conductivity type; a layered structure including at least a first cladding layer of the first conductivity type, an active layer, and a second cladding layer of a second conductivity type, the layered structure being provided on the semiconductor substrate; a current blocking structure, having a striped concave portion therein, formed on the layered structure; and a third cladding layer of the second conductivity type provided so as to cover the striped concave portion and the current blocking structure. The current blocking structure includes at least a saturable absorbing layer having a forbidden band width which is substantially equal to a forbidden band width of the active layer.

According to another aspect of the invention, a semiconductor laser device includes: a semiconductor substrate of a first conductivity type; a layered structure including at least a first cladding layer of the first conductivity type, an active layer, and a second cladding layer of a second conductivity type, the layered structure being provided on the semiconductor substrate; a striped mesa region including at least a third cladding layer of the second conductivity type and a contact layer of the second conductivity type, the striped mesa region being formed on the layered structure; and a current blocking structure provided on the layered structure so as to sandwich the striped mesa region. The current blocking structure includes at least a saturable absorbing layer having a forbidden band width which is substantially equal to a forbidden band width of the active layer, the saturable absorbing layer covering side surfaces of the striped mesa region.

A method for producing a semiconductor laser device of the invention includes the steps of: growing a layered structure on a semiconductor substrate of a first conductivity type, the layered structure including at least a first cladding layer of the first conductivity type, an active layer, and a second cladding layer of a second conductivity type; growing a current blocking structure including at least a saturable absorbing layer having a forbidden band width which is substantially equal to a forbidden band width of the active layer; forming a striped concave portion in the current blocking structure by etching; and growing a third cladding layer of the second conductivity type so as to cover the striped concave portion and the current blocking structure.

According to another aspect of the invention, a method for producing a semiconductor laser device includes the steps of: growing a layered structure on a semiconductor substrate of a first conductivity type, the layered structure including at least a first cladding layer of the first conductivity type, an active layer, and a second cladding layer of a second conductivity type; sequentially growing a third cladding layer of the second conductivity type and a contact layer of the second conductivity type on the layered structure; forming a striped mesa region by etching the third cladding layer and the contact layer; and growing a current blocking structure on the layered structure so as to sandwich the striped mesa region, the current blocking structure including at least a saturable absorbing layer having a forbidden band width which is substantially equal to a forbidden band width of the active layer, the saturable absorbing layer being formed so as to cover side surfaces of the striped mesa region.

In a semiconductor laser device according to the present invention, a saturable absorbing layer is formed inside a current blocking structure. A sufficiently strong self-sustained pulsation is realized by employing a saturable absorbing function of the saturable absorbing layer. Thus, a low noise characteristic is achieved during an operation of the semiconductor laser device. Furthermore, the amount of light that leaks into the portions of an active layer outside the striped concave portion can be decreased, as well as the active layer being able to be made thinner. Therefore, problems such as deterioration of optical characteristics and decreased reliability are not caused.

Moreover, a saturable absorbing layer in the current blocking structure offsets from the center portion of the oscillation region. Thus, the amount of light absorbed therein can be decreased. As a result, increases in an oscillation starting current and a driving current are not caused.

The portions of the active layer outside the striped concave portion can also act as saturable absorbers in order to obtain an additional saturable absorbing function. By doing so, a wider range of parameters for solving the above-mentioned problems can be accepted.

Alternatively, in another semiconductor laser device according to the present invention, a layered structure, including a cladding layer and an active layer, is formed on a semiconductor substrate. Moreover, a striped mesa region is formed on the layered structure. A current blocking structure is formed so as to sandwich the striped mesa region. The current blocking structure includes a saturable absorbing layer which covers each of the side surfaces of the striped mesa region. By having such a structure, the self-sustained pulsation characteristic (i.e., a noise characteristic) of the semiconductor laser device is further improved.

Moreover, in the case where the saturable absorbing layer in the current blocking structure is a p-type layer, the self-sustained pulsation becomes stronger as compared to an n-type saturable absorbing layer. This increase is due to the ratio of the amount of change in the light absorbing characteristic of the saturable absorbing layer to the amount of change in a carrier density concentration (which is generated by light absorbed in the saturable absorbing layer) being greater in the case of the p-type saturable absorbing layer than that in the case of the n-type saturable absorbing layer. This fact results from aptness and an intensity of the self-sustained pulsation.

In addition, when an n-type semiconductor layer is provided adjacent to the layered structure in the case where the p-type saturable absorbing layer is used, the n-type semiconductor layer acts as a current blocking layer. In such case, the semiconductor laser device can be operated with a substantially lower current as compared to the case where a p-type semiconductor layer is used instead of the n-type semiconductor layer.

Thus, the invention described herein makes possible the advantages of (1) providing a high output-power semiconductor laser device having a strong self-sustained pulsation characteristic for obtaining an excellent low-noise characteristic, without experiencing disadvantages in the operation characteristics of the device, such as, for example, deterioration of an optical characteristic, poor reliability, and an increase in an operation current; and (2) a method for producing the semiconductor laser device.

These and other advantages of the present invention will become apparent to those skilled in the art upon reading and understanding the following detailed description with references to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
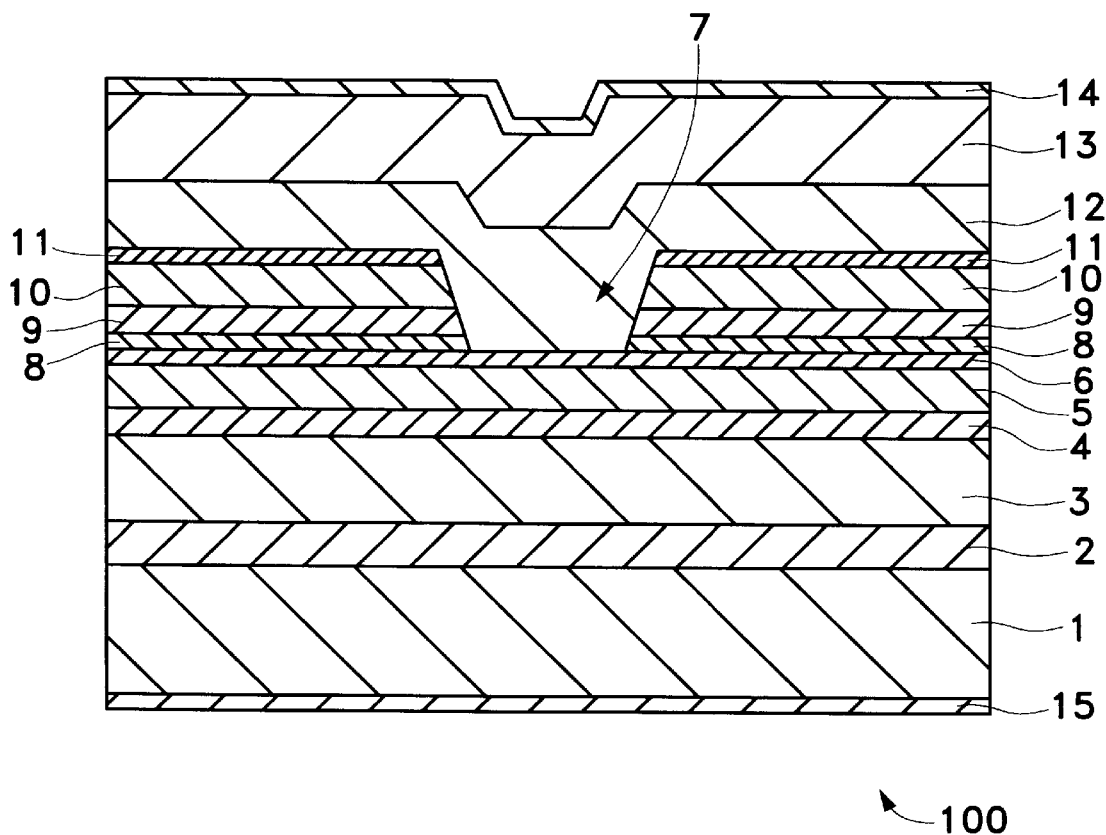
FIG. 1 is a cross-sectional view showing a semiconductor laser device according to a first example of the present invention.

FIG. 1 is a cross-sectional view showing a semiconductor laser device 100 according to a first example of the present invention.

As shown in FIG. 1, the semiconductor laser device 100 includes an n-GaAs buffer layer 2 (thickness: 0.5 $\mu$m), an n-Al$_y$Ga$_{1-y}$As first cladding layer 3 (y=0.5, thickness: 1.5 $\mu$m), an undoped Al$_x$Ga$_{1-x}$As active layer 4 (x=0.14, thickness: 0.05 $\mu$m), a p-Al$_y$Ga$_{1-y}$As second cladding layer 5 (y=0.5, thickness: 0.25 $\mu$m) and a p-GaAs etching stopping layer 6 (thickness: 0.003 $\mu$m) sequentially provided on an n-GaAs substrate 1. Furthermore, a p-Al$_u$Ga$_{1-u}$As etching stopping layer 8 (u=0.6, thickness: 0.02 $\mu$m), an n-Al$_{1-v}$Ga$_v$As first current blocking layer 9 (v=0.14, thickness: 0.25 $\mu$m) as a saturable absorbing layer, an n-Al$_w$Ga$_{1-w}$As second current blocking layer 10 (w=0.6, thickness: 0.35 $\mu$m) and an n-GaAs protection layer 11 (thickness: 0.01 $\mu$m) are sequentially provided on the etching stopping layer 6. According to the first example of the present invention, the first current blocking layer 9 (i.e., the saturable absorbing layer) and the second current blocking layer 10 form a current blocking structure.

A striped groove (i.e., a striped concave portion 7) is formed from the surface of the protection layer 11 to the surface of the etching stopping layer 6. The striped concave portion 7 divides each of the etching stopping layer 8, the first current blocking layer 9, the second current blocking layer 10 and the protection layer 11 into two portions. The width of the uppermost part of the striped concave portion 7 is about 2.5 μm.

A p-$Al_xGa_{1-x}As$ third cladding layer 12 (z=0.5, thickness: 1.2 μm) and a p-GaAs cap layer 13 (thickness: 1.0 μm) are sequentially provided on the striped concave portion 7 and the protection layer 11. Furthermore, a p-side electrode 14 is provided on an upper surface of the cap layer 13 and an n-side electrode 15 is provided on a bottom surface of the substrate 1.

Figure 2A:
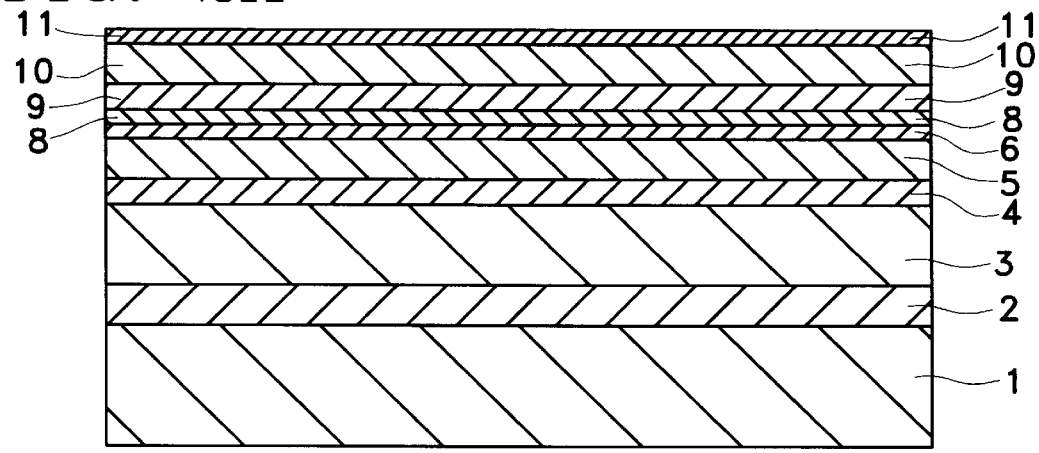
FIGS. 2A through 2C are cross-sectional views showing steps of producing the semiconductor laser device according to the first example of the present invention.
Figure 2B:
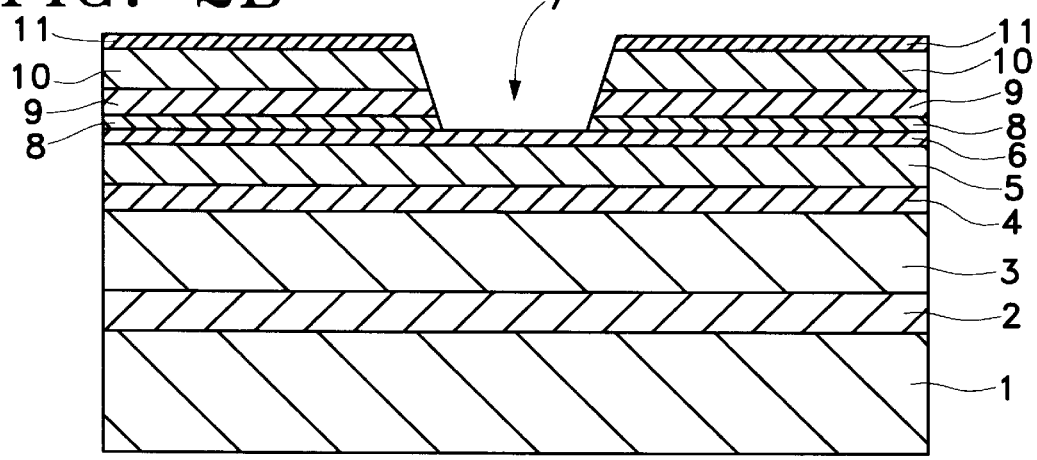
Figure 2C:
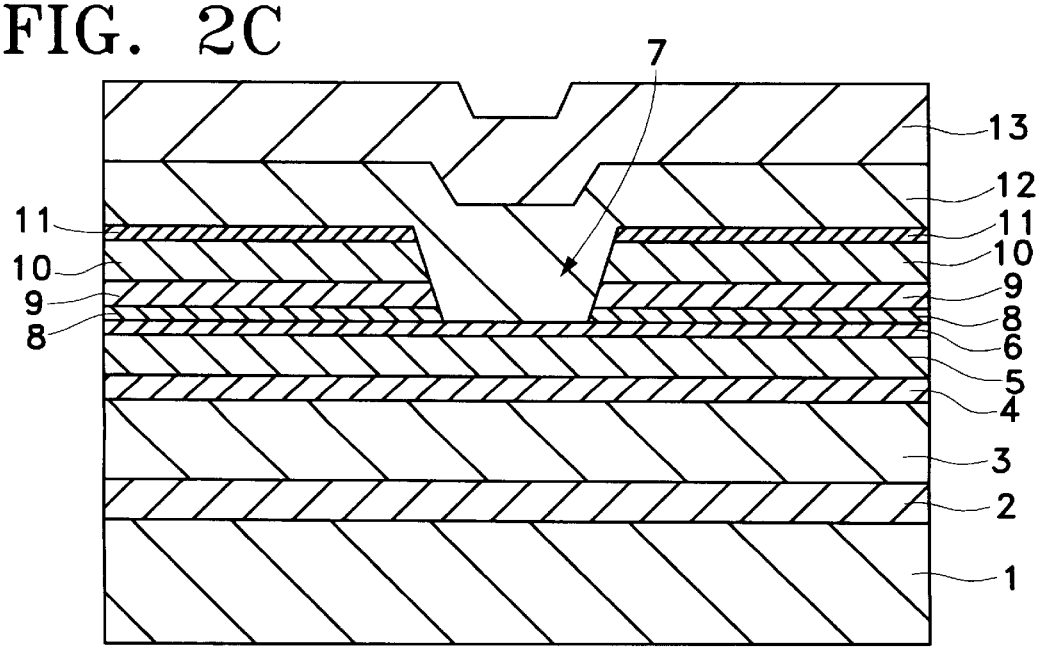

Hereinafter, a method for producing the semiconductor laser device 100 will be described with reference to FIGS. 2A through 2C. FIGS. 2A through 2C are cross-sectional views showing the steps for producing the semiconductor laser device 100.

As shown in FIG. 2A, the n-GaAs buffer layer 2, the n-$Al_yGa_{1-y}As$ first cladding layer 3, the undoped AlGaAs active layer 4, the p-$Al_yGa_{1-y}As$ second cladding layer 5, the p-GaAs etching stopping layer 6, the p-$Al_uGa_{1-u}As$ etching stopping layer 8, the n-$Al_vGa_{1-v}As$ first current blocking layer 9, the n-$Al_wGa_{1-w}As$ second current blocking layer 10 and the n-GaAs protection layer 11 are sequentially grown on the n-GaAs substrate 1 in a wafer state by an MOCVD method.

Next, the processed wafer is taken out from the MOCVD apparatus. As shown in FIG. 2B, a striped concave portion 7 is formed in the obtained wafer from the surface of the protection layer 11 such that the surface of the p-GaAs etching stopping layer 6 is exposed, using a method such as photolithography or selective etching.

Thereafter, the obtained wafer with the striped concave portion 7 is again placed in the MOCVD apparatus. As shown in FIG. 2C, the p-$Al_xGa_{1-x}As$ third cladding layer 12 and the cap layer 13 are grown over the striped concave portion 7 and the protection layer 11.

Then, a portion of the substrate 1 is polished away from the bottom surface such that the thickness thereof becomes about 100 μm. Thereafter, the p-side electrode 14 is formed on the upper surface of the cap layer 13 and the n-side electrode 15 is formed on the bottom surface of the substrate 1. Finally, the thus-obtained wafer is divided into individual chips and the side surfaces of each chip are coated to obtain a high output-power. Thus, the semiconductor laser device 100 is completed.

In the above-described method for producing the semiconductor laser device 100 according to the first example of the present invention, each of the layers, including the first current blocking layer 9 functioning as the saturable absorber and the active layer 4, is deposited before forming the striped concave portion 7 by etching. Thus, the semiconductor laser device can be produced easily with a high yield and a substantially low production cost.

When a voltage is applied between the electrodes 14 and 15 of the above-described semiconductor laser device 100, a current is injected into the active layer 4 via the striped concave portion 7, thereby starting oscillation of the laser beams. In the case of the semiconductor laser device 100 according to the first example of the present invention, an Al mole fraction of the second current blocking layer 10 is 0.6 which is sufficiently greater than an Al mole fraction of the active layer 4 (i.e., 0.14). Therefore, the second current blocking layers 10 do not absorb the laser beams generated at the active layer 4, and thus, a substantially lower operation current characteristic is realized. Typically, the semiconductor laser device 100, according to the first example of the present invention, has an oscillation starting current of 30 mA, while an operation current of approximately 70 mA is required for an output power of 35 mW.

In the semiconductor laser device 100, the width of the injected current is controlled by the width of the striped concave portion 7. Most of the current is injected into the portion of the active layer 4 having a width which is generally equivalent to that of the striped concave portion 7. On the other hand, the light in the striped concave portion 7 is substantially weakly confined. Consequently, the generated light spreads over a wider width than the inner width of the striped concave portion 7, and therefore, the active layer 4, which is located outside the striped concave portion 7, acts as a saturable absorber. Moreover, the light also spreads into part of the first current blocking layer 9, and thus, part of the first current blocking layer 9 also acts as a saturable absorber.

Figure 3:
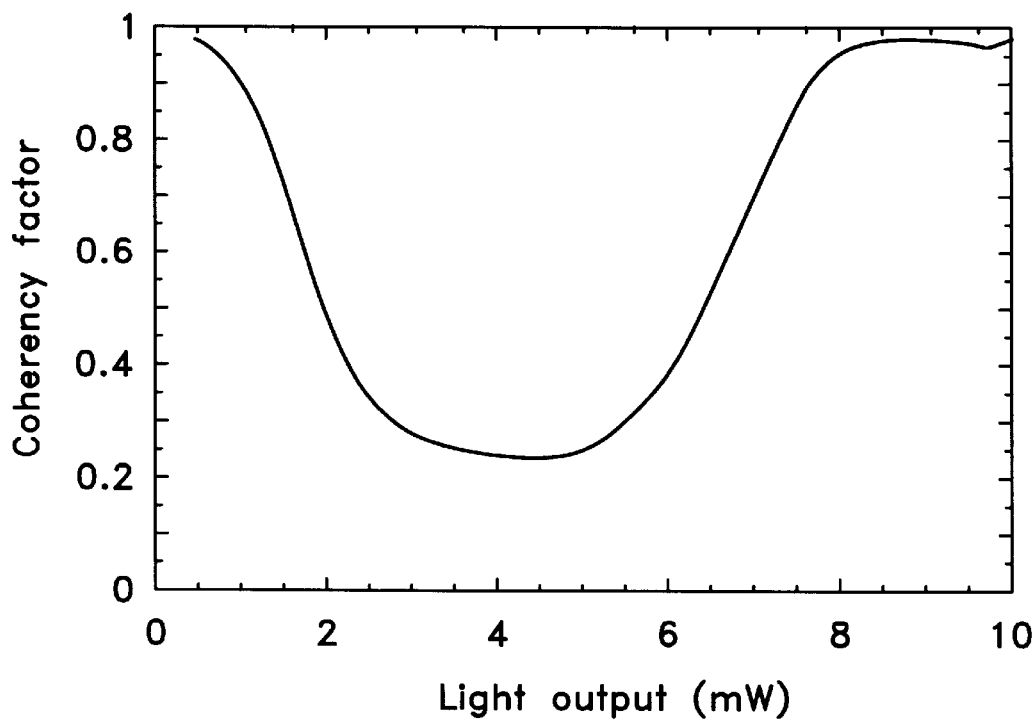
FIG. 3 is a graph showing a coherency factor characteristic of the semiconductor laser device according to the first example of the present invention.

FIG. 3 is a graph showing a characteristic of the semiconductor laser device 100. Specifically, the graph represents the results of the light output-power dependency of the coherency factor of the laser beam, which substantially indicates self-sustained pulsation characteristics.

As shown in the graph, the coherency factor starts to decline after the light output-power exceeds about 1 mW and exhibits an extremely low value when the light output-power is 2 mW. This characteristic is equivalent to a self-sustained pulsation characteristic of a low output-power laser having a low noise characteristic incorporated in CD players, or the like.

Figure 4:
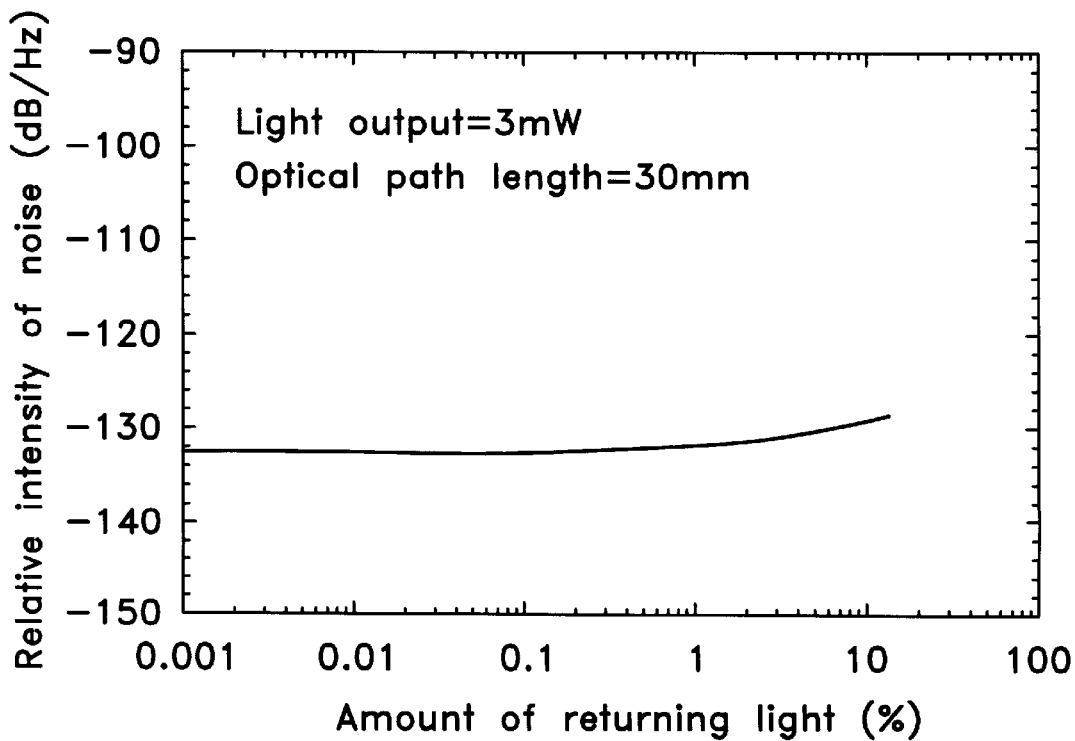
FIG. 4 is a graph showing a noise characteristic by returning light of the semiconductor laser device according to the first example of the present invention.

FIG. 4 is a graph showing another characteristic of the semiconductor laser device 100. Specifically, the curve in the graph represents the results of noise by returning light characteristics of the semiconductor laser device 100. More specifically, the curve represents the results of the relative intensity of noise (hereinafter, also simply referred to as "RIN") determined by varying the amount of returning light in the range of 0.001% to 10%, where the optical path length is 30 mm and the light output-power is 3 mW.

As shown in the graph, a substantially low RIN value of approximately −130 dB/Hz or lower is obtained for all of the amount of returning light in the above-mentioned range.

Figure 5:
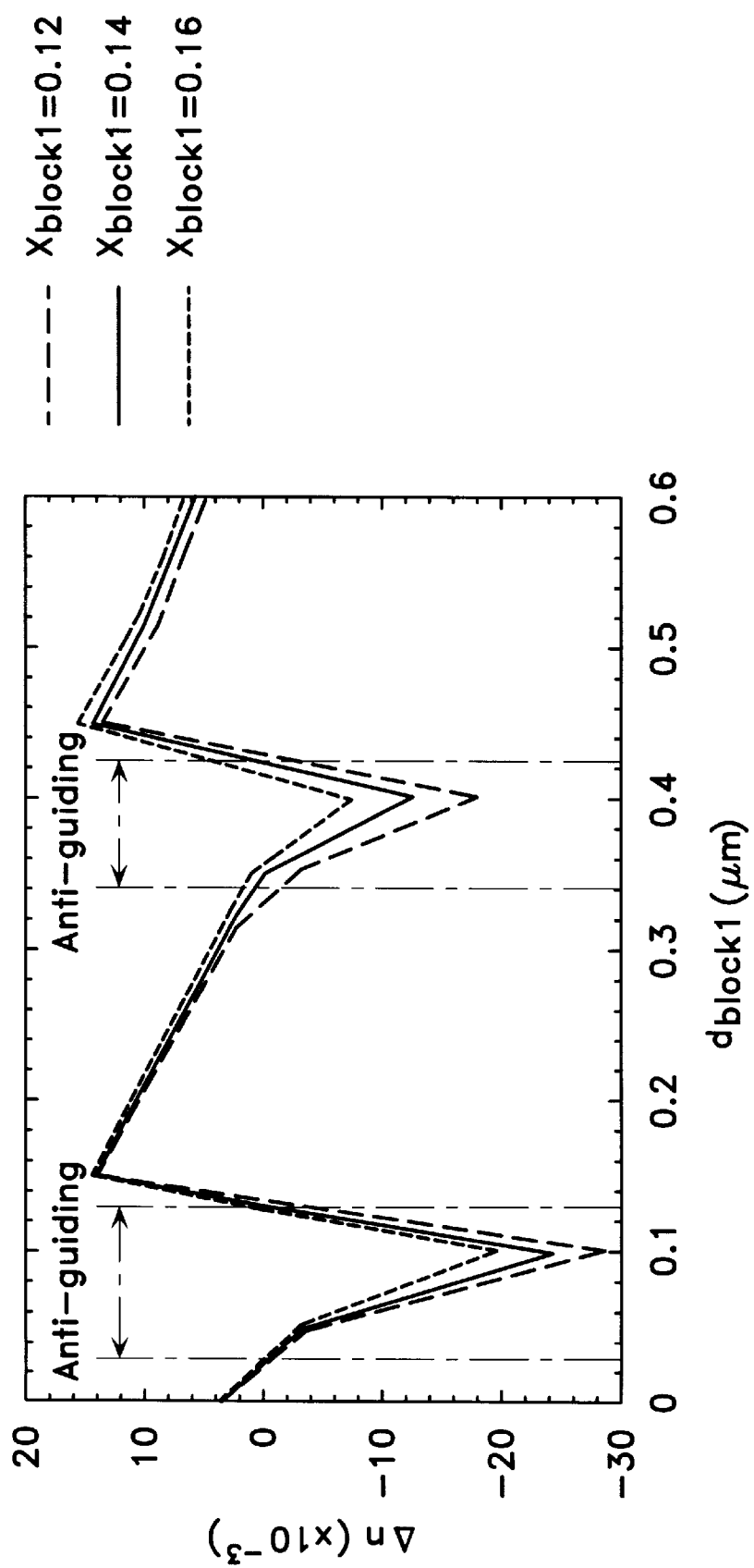
FIG. 5 is a graph showing a relationship between a thickness ($d_{block1}$) of a first current blocking layer and the difference in the effective refractive index $\Delta n$ of the semiconductor laser device according to the first example of the present invention.

FIG. 5 is a graph showing still another characteristic of the semiconductor laser device 100. Specifically, the curves in the graph represent changes of the differences (Δn) of an effective refractive index between the inside and the outside of the striped concave portion 7, when a thickness ($d_{block1}$) of the first current blocking layer 9, functioning as the saturable absorber, is changed. More specifically, the results are determined for three different Al mole fractions of the first current blocking layer 9 ($X_{block1}$), i.e., 0.12, 0.14 and 0.16.

As shown in the graph, in the case where the thickness ($d_{block1}$) of the first current blocking layer 9 is in either of the following ranges of approximately $0.03 \ \mu m \leq d_{block1} \leq 0.13 \ \mu m$ and approximately $0.34 \ \mu m \leq d_{block1} \leq 0.42 \ \mu m$, the effective refractive index within the striped concave portion 7 becomes less than that of the outside of the striped concave portion 7 (i.e., Δn becomes 0 or less). In other words, when $d_{block1}$ is within these ranges, the semiconductor laser device is operated in an anti-guiding mode. When the semiconductor laser device 100 is operated in such an anti-guiding mode, it becomes difficult to confine light within the striped concave portion 7, and thus, the laser oscillation characteristic becomes unstable.

The regions in the graph indicated as "anti-guiding" are obtained when the $X_{block1}$ is 0.14. The "anti-guiding" regions vary depending on the value of the $X_{block1}$. Basically, the "anti-guiding" regions correspond to the regions in the graph of FIG. 5 where Δn is 0 or less.

Hereinafter, other characteristics of the semi-conductor laser device 100, when it is not operated in the anti-guiding mode, will be described.

Figure 6:
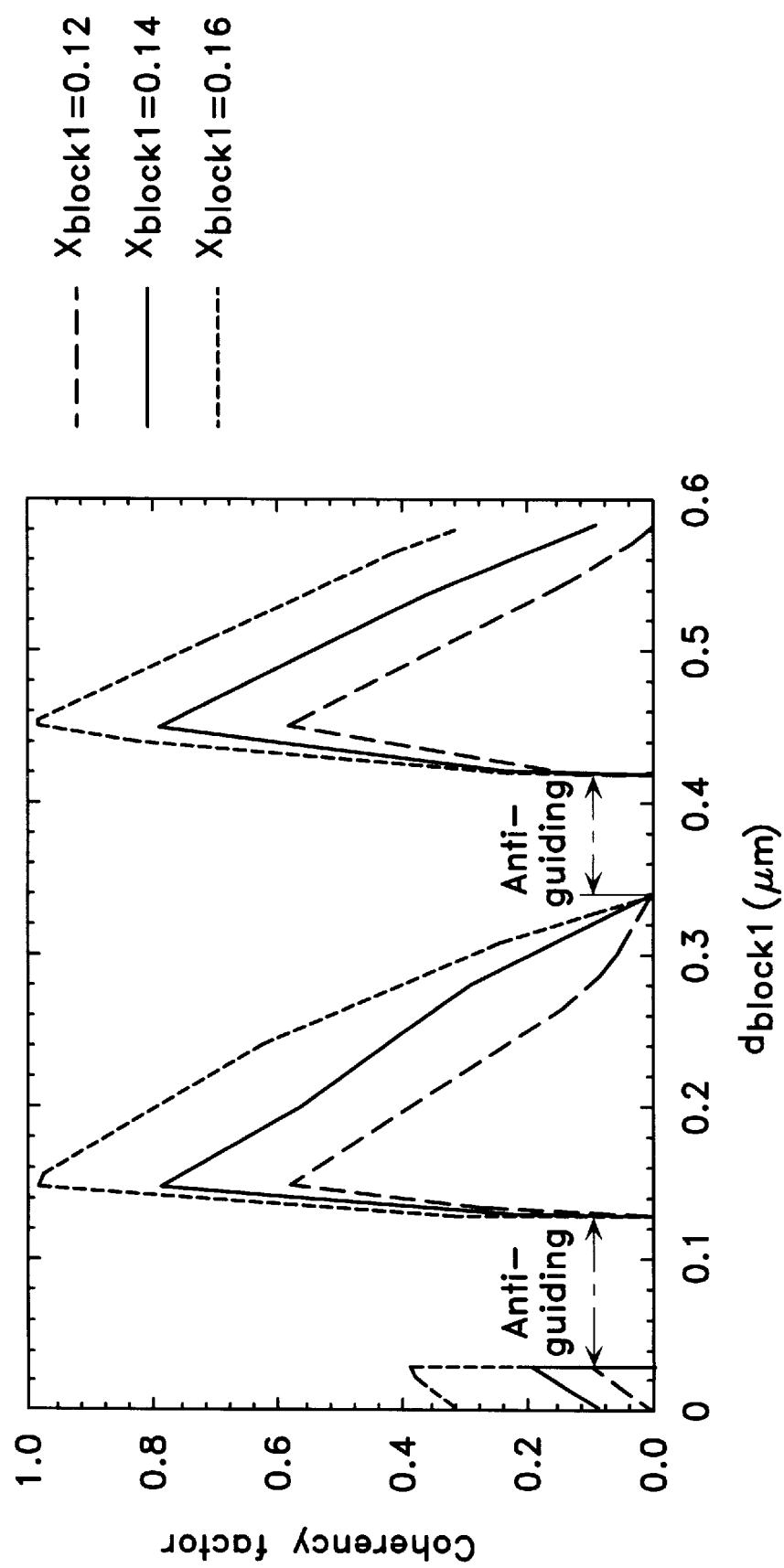
FIG. 6 is a graph showing a relationship between the thickness ($d_{block1}$) of the first current blocking layer and a coherency factor of the semiconductor laser device according to the first example of the present invention.

FIG. 6 is a graph showing a characteristic of the semiconductor laser device 100. Specifically, curves in the graph represent changes in the coherency factor when the thickness ($d_{block1}$) of the first current blocking layer 9, functioning as the saturable absorber, is changed, where the light output-power is maintained at 3 mW. More specifically, the results are determined for three different Al mole fractions ($X_{block1}$) of the first current blocking layer 9, i.e., 0.12, 0.14 and 0.16.

In order to realize a low-noise characteristic of the semiconductor laser device 100, the coherency factor should be 0.5 or less. However, the coherency factor tends to increase as the Al mole fraction $X_{block1}$ of the first current blocking layer 9 increases. Particularly, in the case where the $X_{block1}$ is greater than 0.16, regions (excluding the "anti-guiding" regions) where the coherency factor is 0.5 or less are extremely small. Thus, in terms of a coherency factor characteristic, the Al mole fraction $X_{block1}$ of the first current blocking layer 9 is preferably set to 0.16 or less.

Figure 7:
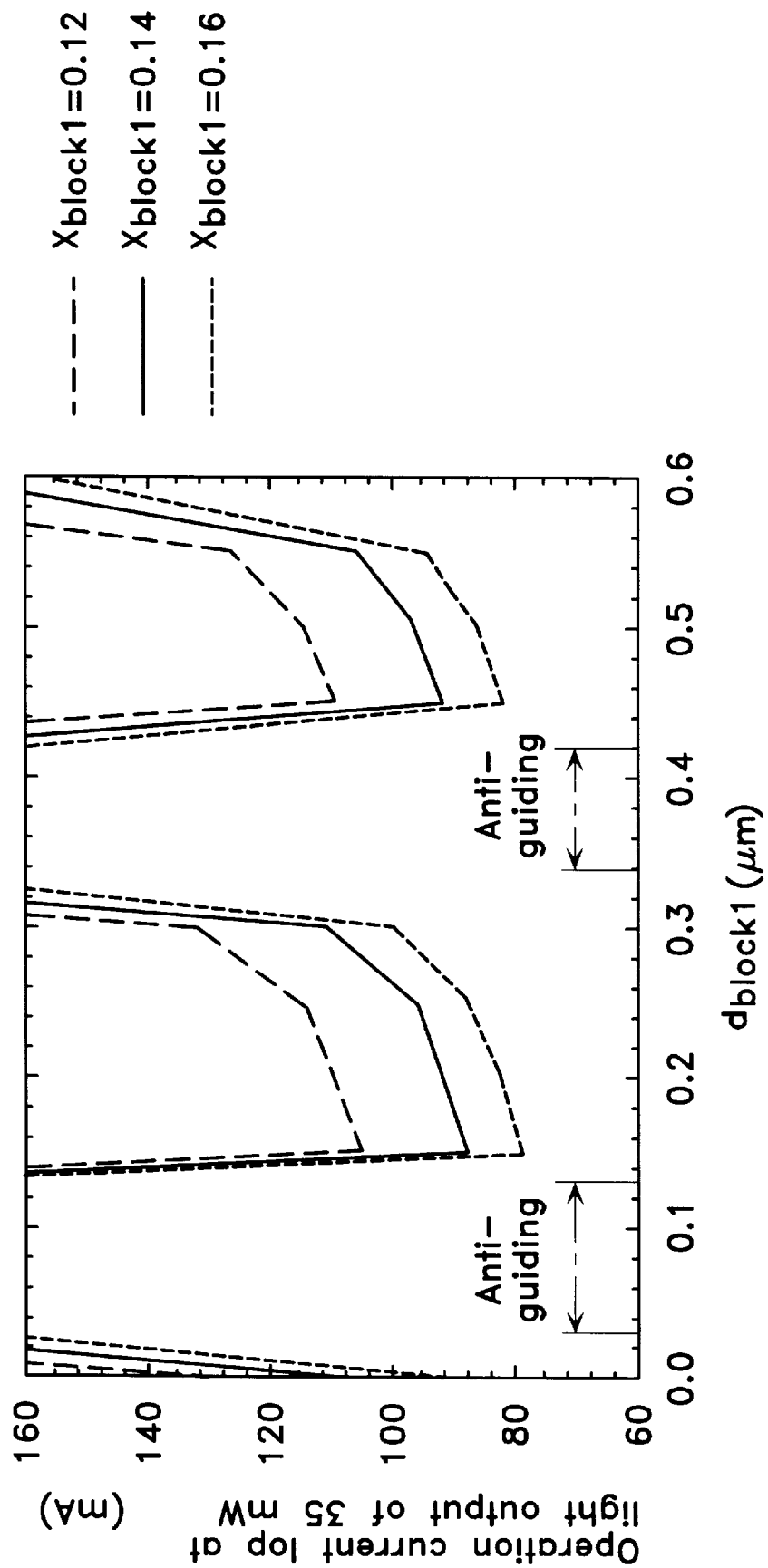
FIG. 7 is a graph showing a relationship between the thickness ($d_{block1}$) of the first current blocking layer and an operation current of the semiconductor laser device according to the first example of the present invention.

FIG. 7 is a graph showing another characteristic of the semiconductor laser device 100. Specifically, curves in the graph represent changes in an operation current ($I_{OP}$) when a thickness ($d_{block1}$) of the first current blocking layer 9 is changed. The light output-power is set to 35 mW. More specifically, results are determined for three different Al mole fractions ($X_{block1}$) of the first current blocking layer 9, i.e., 0.12, 0.14 and 0.16.

As shown in graph of FIG. 7, the operation current $I_{OP}$ tends to increase as the Al mole fraction $X_{block1}$ of the first current blocking layer 9 decreases. Particularly, in the case where the $X_{block1}$ is less than 0.12, the operation current $I_{OP}$ increases to 110 mA or more. Thus, in terms of an operation current characteristic, the Al mole fraction $X_{block1}$ of the first current blocking layer 9 is preferably set to 0.12 or more.

Each of the forbidden band widths of the active layer 4 and the first current blocking layer 9 functioning as the saturable absorbers are determined by the Al mole fraction of each of the layers. In the above, the Al mole fraction ($X_{block1}$) of the first current blocking layer 9 is described to be equal to the Al mole fraction of the active layer 4 (i.e., 0.14). Alternatively, both Al mole fractions can be of another value as long as the values are generally equal. Specifically, the Al mole fraction ($X_{block1}$) of the first current blocking layer 9 is preferably set within the range of $0.12 \leq X_{block1} \leq 0.16$ so as to satisfy the foregoing conditions described with reference to the graphs in FIGS. 6 and 7.

The above-mentioned range of the Al mole fraction ($X_{block1}$) of the first current blocking layer 9 is applicable in the case where the Al mole fraction x of the $Al_xGa_{1-x}As$ active layer 4 is 0.14.

More generally, the same effect as described above can be obtained when the Al mole fraction $X_{block1}$ of the first current blocking layer 9, which determines an effective forbidden band width thereof (functioning as the saturable absorbing layer), and the Al mole fraction x of the active layer 4, which determines an effective forbidden band width thereof, satisfy the relationship $(x-0.02) \leq X_{block1} \leq (x+0.02)$.

For example, in the case where the active layer and/or the saturable absorbing layer have a quantum well structure or a superlattice structure, the Al mole fraction of each layer in the active layer and/or the saturable absorbing layer cannot be specified. Even in such case, the effect of the present invention is obtainable as long as the above-mentioned relationship is satisfied for the Al mole fractions of equivalent AlGaAs layers constituting the active layer and/or the saturable absorbing layer. The relationship is determined by the operation characteristics such as a light emitting characteristic, an oscillation wavelength, an absorption characteristic and the like.

Figure 8:
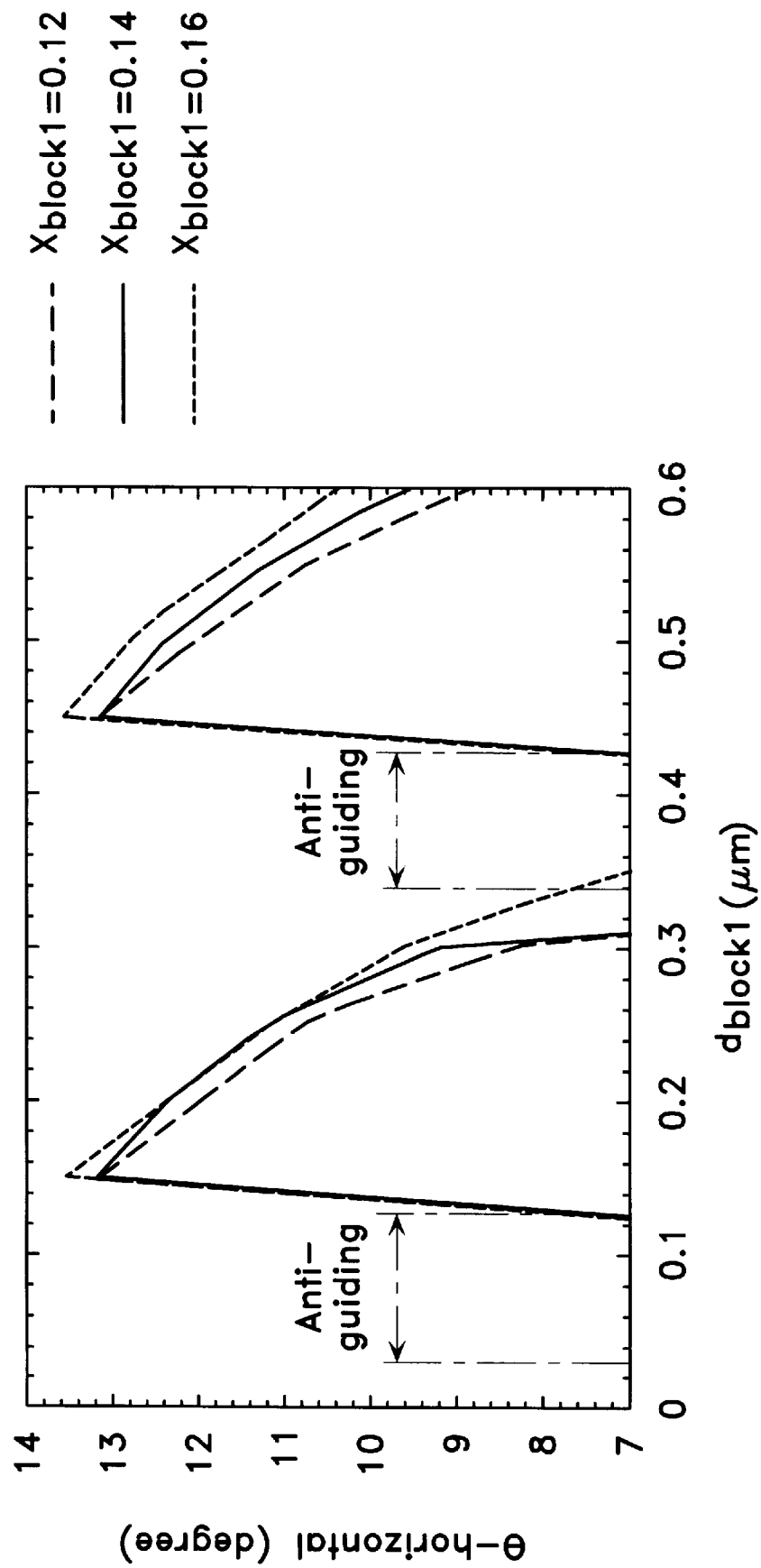
FIG. 8 is a graph showing a relationship between the thickness ($d_{block1}$) of the first current blocking layer and a radiation angle characteristic of an emitted laser beam with respect to a horizontal direction ($\theta$-horizontal) of the semiconductor laser device according to the first example of the present invention.

FIG. 8 is a graph showing still another characteristic of the semiconductor laser device 100. Specifically, curves of the graph represent a radiation angle characteristic of an emitted laser beam with respect to a horizontal direction when the thickness ($d_{block1}$) of the first current blocking layer 9 is changed. In other words, the curves represent the change in a half width in a horizontal direction with respect to a far field pattern of the emitted laser beams (hereinafter, simply referred to as "Θ-horizontal"). More specifically, results are determined for three different Al mole fractions ($X_{block1}$) of the first current blocking layer 9, i.e., 0.12, 0.14 and 0.16.

In general, the optical characteristics become undesirable when the Θ-horizontal is less than 9 degrees. As can be appreciated from the graph in FIG. 8, the Θ-horizontal is 9 degrees or more when the thickness ($d_{block1}$) of the first current blocking layer 9 is generally in either of the following ranges: $0.14\ \mu m \leq X_{block1} \leq 0.30\ \mu m$; and $0.44\ \mu m \leq X_{block1} \leq 0.58\ \mu m$.

The thickness ($d_{block1}$) of the first current blocking layer 9 is preferably set to be in the above-described ranges so as to satisfy the above-mentioned conditions described with reference to the graphs in FIGS. 6 through 8.

The semiconductor laser device 100 according to the first example of the present invention is provided with the etching stopping layers 6 and 8 (FIG. 1) to enhance the reproducibility and controllability of the semiconductor laser device during production. Thus, the same effects can be obtained even in the case where the etching stopping layers 6 and 8 are not provided.

EXAMPLE 2

Figure 9:
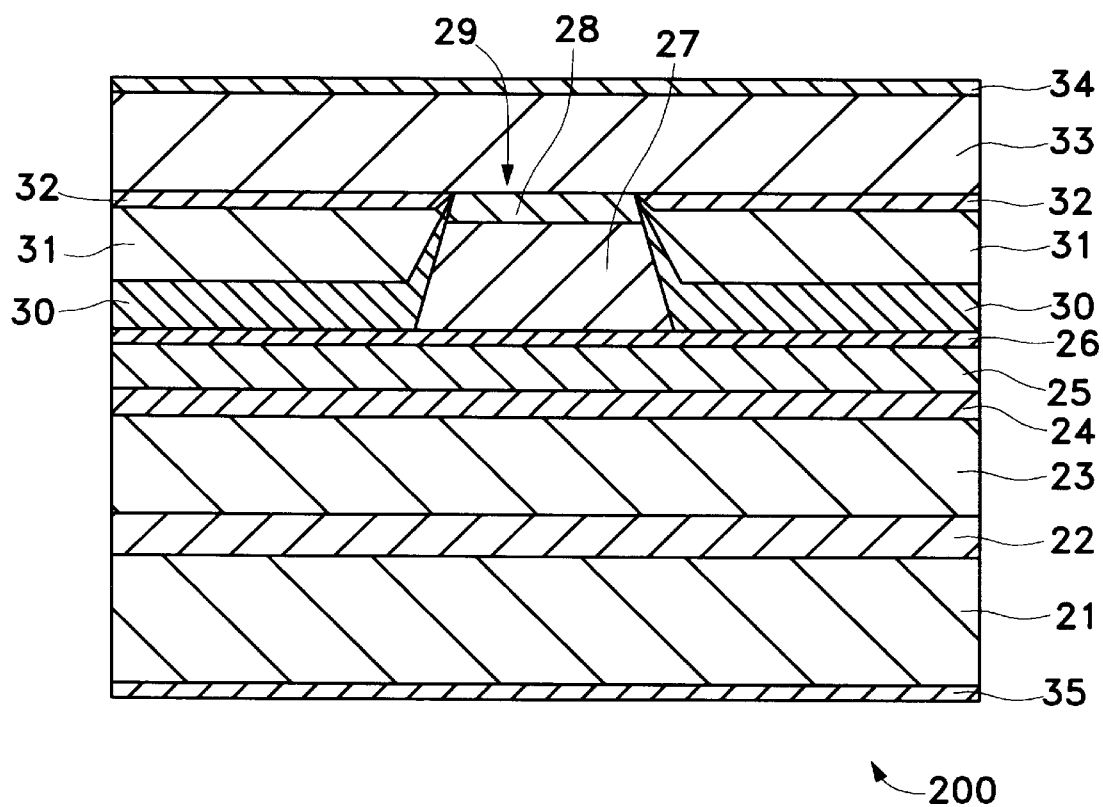
FIG. 9 is a cross-sectional view showing a semiconductor laser device according to a second example of the present invention.

FIG. 9 is a cross-sectional view showing a semiconductor laser device 200 according to a second example of the present invention.

The semiconductor laser device 200 includes an n-GaAs buffer layer 22 (thickness: 0.5 μm), an n-$Al_yGa_{1-y}As$ first cladding layer 23 (y=0.5, thickness: 1.5 μm), an MQW active layer 24, a p-$Al_yGa_{1-y}As$ second cladding layer 25 (thickness: 0.30 μm) and a p-GaAs etching stopping layer 26 (thickness: 0.003 μm) sequentially provided on an n-GaAs substrate 21. Furthermore, a striped mesa region 29 including a p-$Al_zGa_{1-z}As$ third cladding layer 27 (z=y, thickness: 1.2 μm) and a p-GaAs contact layer 28 (thickness: 0.5 μm) is provided on the etching stopping layer 26. The width of the mesa region 29 is about 2.5 μm.

Moreover, an n-type current blocking layer 30, a p-$Al_wGa_{1-w}As$ light confining layer 31 (w=0.7, thickness: 0.43 μm) and a p-GaAs protection layer 32 are sequentially provided on the etching stopping layer 26 so as to sandwich the mesa region 29. The current blocking layer 30 has a superlattice structure of an n-Al$_v$Ga$_{1-v}$As layer (v=0.5, thickness: 1 nm) and an n-GaAs layer (thickness: 2.5 nm). The superlattice structure has an average Al mole fraction of 0.13 and a total thickness of 0.27 µm. The current blocking layer 30 acts as a saturable absorbing layer for the oscillated laser beams. According to the second example of the present invention, the current blocking layer 30, which acts as a saturable absorbing layer, forms a current blocking structure.

A p-GaAs cap layer 33 (thickness: 1 µm) is provided on the striped mesa region 29 and the protection layer 32. Furthermore, a p-side electrode 34 is provided on an upper surface of the cap layer 33 and an n-side electrode 35 is provided on a bottom surface of the substrate 21.

The MQW active layer 24 includes an Al$_{0.3}$Ga$_{0.7}$As guide layer (thickness: 20 nm), five Al$_{0.1}$Ga$_{0.9}$As well layers (thickness: each 10 nm) and four Al$_{0.3}$Ga$_{0.7}$As barrier layers (thickness: each 8 nm). The well layers and the barrier layers are deposited alternately.

In such structure, since the side surfaces of the striped mesa region 29 are covered with the current blocking layer 30, functioning as the saturable absorber, the self-sustained pulsation characteristic (i.e., the noise characteristic) of the semiconductor laser device is further improved.

Figure 10A:
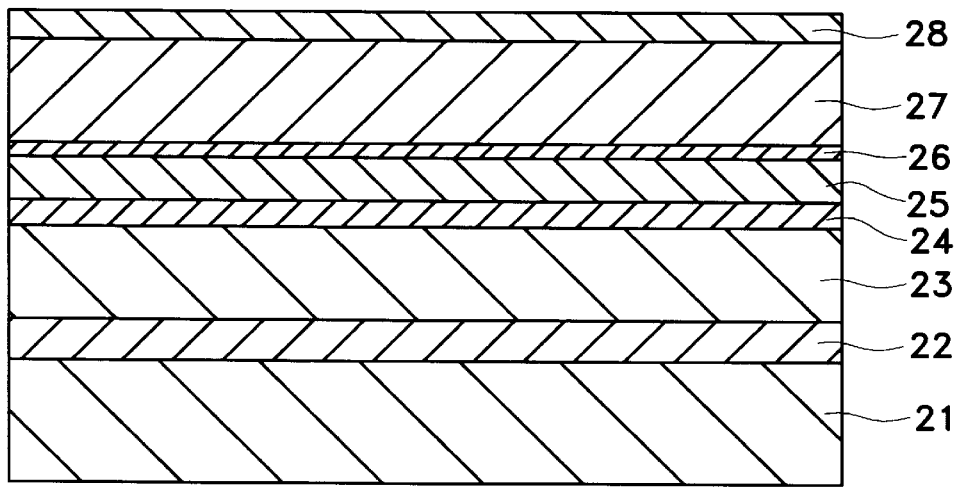
FIGS. 10A through 10C are cross-sectional views showing steps for producing the semiconductor laser device according to the second example of the present invention.
Figure 10B:
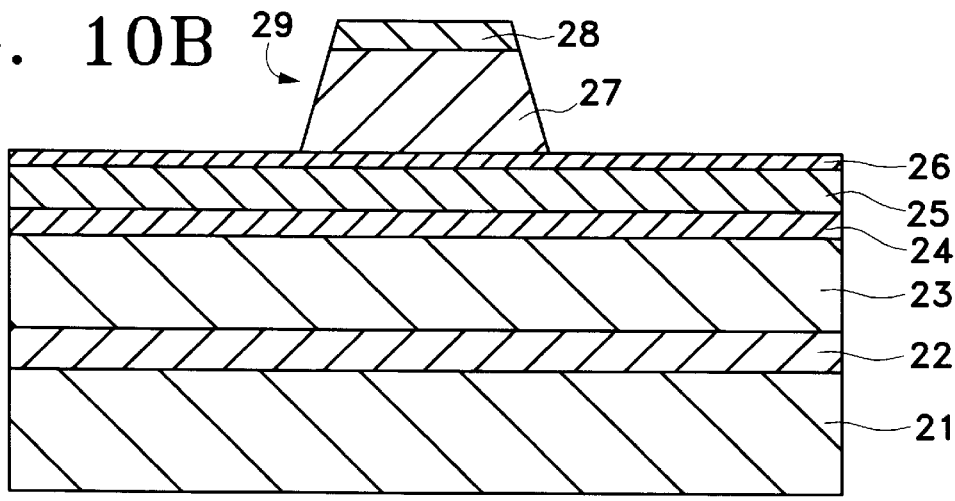
Figure 10C:
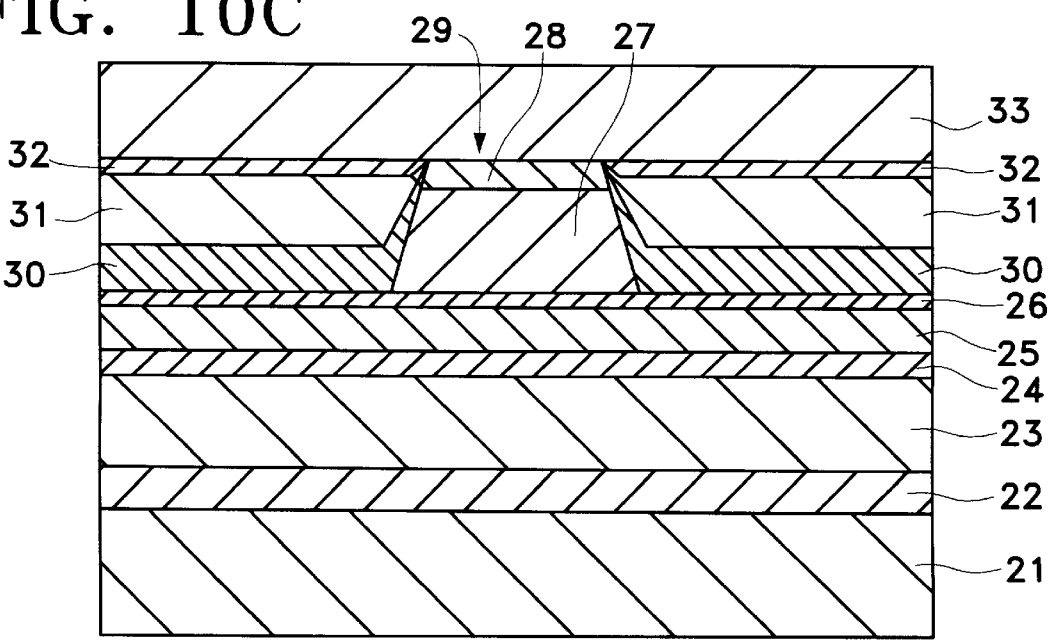

Hereinafter, a method for producing the semiconductor laser device 200 will be described with reference to FIGS. 10A through 10C. FIGS. 10A through 10C are cross-sectional views showing the steps of producing the semiconductor laser device 200.

First, as shown in FIG. 10A, the n-GaAs buffer layer 22, the n-Al$_y$Ga$_{1-y}$As first cladding layer 23, the MQW active layer 24, the p-Al$_y$Ga$_{1-y}$As second cladding layer 25, the p-GaAs etching stopping layer 26, the p-Al$_x$Ga$_{1-x}$As third cladding layer 27 and the p-GaAs contact layer 28 are sequentially grown on the n-GaAs substrate 21 in a wafer state.

Thereafter, the wafer is taken out of the MOCVD apparatus. An SiN film (thickness: 0.3 µm) is formed on the contact layer 28 by a plasma CVD method, or the like. Then, portions of the third cladding layer 27 and the contact layer 28 on the etching stopping layer 26 are removed from the surface of the SiN film so as to leave the striped mesa region 29, as shown in FIG. 10B. In FIG. 10B, the SiN film on the mesa region 29 is omitted.

Thereafter, the resulting wafer with the striped mesa region 29 is again placed into the MOCVD apparatus. As shown in FIG. 10C, the current blocking layer 30 (functioning as the saturable absorbing layer) having the superlattice structure, the p-Al$_w$Ga$_{1-w}$As light confining layer 31 and the p-GaAs protection layer 32 are grown on both sides of the mesa region 29.

In this step, the current blocking layer 30, the light confining layer 31 and the protection layer 32 are also deposited on the SiN film over the striped mesa region 29. However, after the growth of each of the layers 30, 31 and 32, the wafer is taken out from the MOCVD apparatus so as to remove a portion of each of the layers 30, 31 and 32 deposited on the SiN film as well as the SiN film itself. Thereafter, the wafer is again placed into the MOCVD apparatus to form a cap layer 33 by an MOCVD method.

Next, a portion of the substrate 21 is polished away from the bottom surface such that the thickness thereof becomes about 100 µm. Thereafter, the p-side electrode 34 is formed on the upper surface of the cap layer 33 and the n-side electrode 35 is formed on the bottom surface of the substrate 21. Finally, the wafer is divided into individual chips. The end surfaces of each of the chips are coated to obtain high output-power. Thus, the semiconductor laser device 200 is completed.

According to the above-described method of the second example, since the interface between the etching stopping layer 26 and the cladding layer 27 is maintained at its initial state, no disturbance or unevenness exists at the interface. Thus, the operation current can be reduced.

Typically, the semiconductor laser device 200 has an oscillation starting current of 27 mA, while an operation current of 60 mA is required for obtaining an output of 35 mW. Moreover, the coherency factor of the semiconductor laser device 200 is as sufficiently low as that of the semiconductor laser device 100 according to the first example of the present invention. A sufficiently low relative noise intensity is also obtained.

According to the second example of the present invention, the current blocking layer, which acts as the saturable absorbing layer, is of a superlattice structure. Thus, the saturable absorbing characteristic is stepper as compared to that of the saturable absorbing layer of a usual GlGaAs mixed alloy crystal. As a result, a stronger self-sustained pulsation characteristic is obtained upon lower output-power, thereby realizing a substantially low noise characteristic of the device.

EXAMPLE 3

Hereinafter, a semiconductor laser device according to a third example of the present invention will be described.

In each of the above-described first and second examples, a current blocking structure which is made of the n-type current blocking layer(s) (for example, 9, 10) is provided on the p-type etching stopping layer (for example, 8). In the third example, one layer in the current blocking structure, which is in contact with the etching stopping layer, is formed as a p-type layer, and the etching stopping layer is formed as an n-type layer.

In the semiconductor laser device having such a structure, the p-type layer adjacent to the etching stopping layer no longer acts as a current blocking layer. Instead, the p-type layer mainly acts as a saturable absorbing layer. Moreover, the n-type etching stopping layer adjacent to the p-type layer acts as a current blocking layer.

Figure 11:
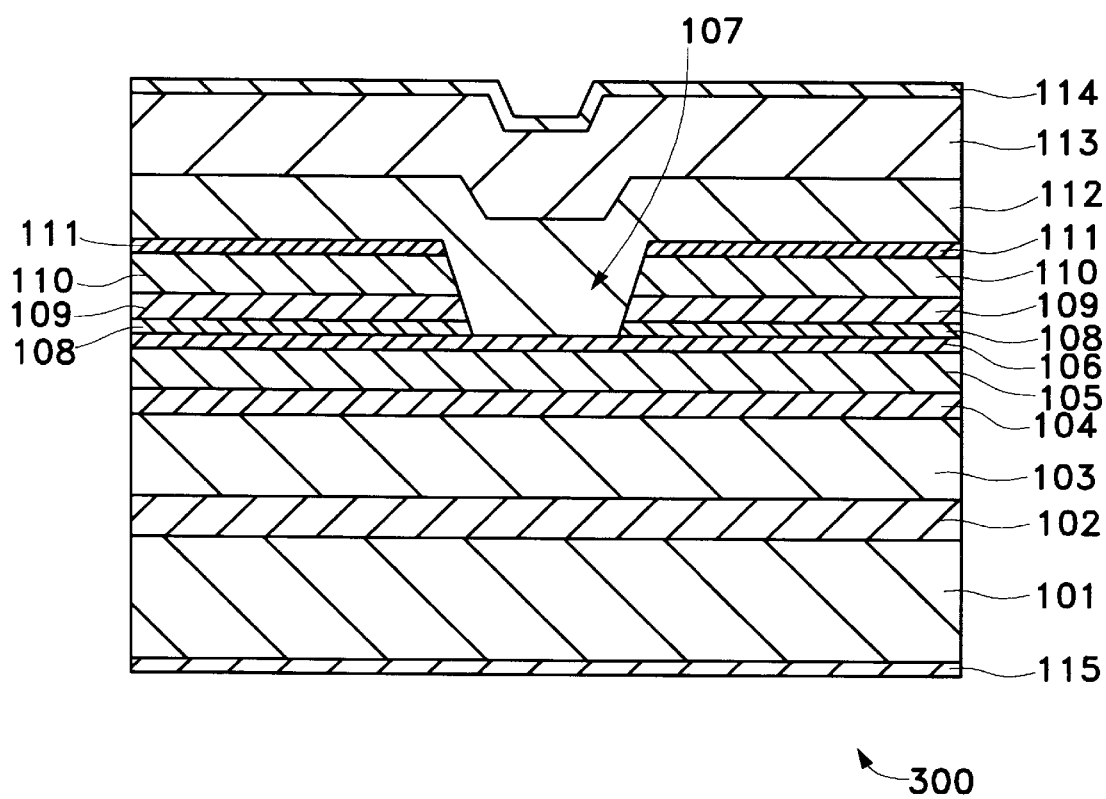
FIG. 11 is a cross-sectional view showing a semiconductor laser device according to a third example of the present invention.

FIG. 11 is a cross-sectional view showing the semiconductor laser device 300 according to the third example of the present invention.

The semiconductor laser device 300 includes an n-GaAs buffer layer 102 (thickness: 0.5 µm), an n-Al$_y$Ga$_{1-y}$As first cladding layer 103 (y=0.5, thickness: 1.5 µm), an undoped Al$_x$Ga$_{1-x}$As active layer 104 (x=0.14, thickness: 0.05 µm), a p-Al$_y$Ga$_{1-y}$As second cladding layer 105 (y=0.5, thickness: 0.25 µm) and a p-GaAs etching stopping layer 106 (thickness: 0.003 µm) sequentially provided on an n-GaAs substrate 101. Furthermore, an n-Al$_u$Ga$_{1-u}$As etching stopping layer 108 (u=0.6, thickness: 0.07 mµ), a p-Al$_v$Ga$_{1-v}$As saturable absorbing layer 109 (v=0.14, thickness: 0.25 µm), an n-Al$_w$Ga$_{1-w}$As current blocking layer 110 (w=0.6, thickness: 0.35 µm) and an n-GaAs protection layer 111 (thickness: 0.01 µm) are sequentially provided on the etching stopping layer 106.

Furthermore, a striped groove (i.e., a striped concave portion 107) is formed from the surface of the protection layer 111 to the surface of the etching stopping layer 106. In other words, the striped concave portion 107 divides each of the etching stopping layer 108, the saturable absorbing layer 109, the current blocking layer 110 and the protection layer 111 into two portions. The width of the uppermost part of the striped concave portion 107 is about 2.5 µm.

Moreover, a p-$Al_xGa_{1-x}As$ third cladding layer 112 (z=0.5, thickness: 1.2 µm) and a p-GaAs cap layer 113 (thickness: 2.0 µm) are sequentially provided so as to cover the striped concave portion 107 and the protection layer 111. Furthermore, a p-side electrode 114 is provided on a surface of the cap layer 113, and an n-side electrode 115 is provided on a bottom surface of the substrate 101.

In the above-described semiconductor laser device 300 according to the third example of the present invention, the p-type saturable absorbing layer 109 in the current blocking structure is used in order to obtain a self-sustained pulsation stronger than that obtainable in the case of an n-type saturable absorbing layer. When the p-type etching stopping layer 108 provided below the p-type saturable absorbing layer 109 is used, instead of an n-type layer, the current that flows from the cap layer 113 to the third cladding layer 112 in the striped concave portion 107 spreads in a transverse direction in the saturable absorbing layer 109. Thus, the current spreads in an extremely wide region, undesirably resulting in increases in the oscillation starting current and the operation current. However, since the etching stopping layer 108 is of the n-type layers according to the third example of the present invention, the current spread can be reduced. Specifically, the n-type etching stopping layer 108 acts as the current blocking layer thereby enabling an operation with a lower current than that the current required in the case where the p-type etching stopping layer is provided.

According to the third example, the current blocking structure includes the etching stopping layer 108, the saturable absorbing layer 109 and the current blocking layer 110. In order to enhance the function of the etching stopping layer 108, which mainly acts as a current blocking layer against the current spread in the saturable absorbing layer 109, the thickness of the etching stopping layer 108 is preferably made as thick as possible as long as no adverse effects occur in terms of the optical characteristics, the self-sustained pulsation characteristics, etc.

Although the etching stopping layer 108 is an n-type single layer in the above explanation of the third example of the present invention, the present invention is not limited thereto. Various structures, such as a double-layer structure having an n-type layer mainly acting for a current block function and a p-type layer mainly acting for an etching stopping function can be employed.

The semiconductor laser device 300 according to the third example of the present invention can correspond to the semiconductor laser device 200 of the second example of the present invention as well as the semiconductor laser device 100 of the first example of the present invention. In such a case, the n-type current blocking layer 30 (i.e., the n-type saturable absorbing layer) is replaced with a p-type saturable absorbing layer. Alternatively, the n-type current blocking layer 30 can be replaced with a p-type saturable absorbing layer and an n-type $Al_tGa_{1-t}As$ current-diffusion preventing layer (e.g., t=0.6 and thickness is 0.05 µm) can be provided between the p-type saturable absorbing layer and the p-type etching stopping layer 26.

In the first, second and third examples of the present invention, an AlGaAs-type semiconductor laser device is described as an example for simplicity of the description. However, the present invention is also applicable for semiconductor laser devices of other material types such as an InGaAlP-type semiconductor laser device.

Moreover, the application of the present invention is not limited to high output-power semiconductor laser devices. The present invention is also applicable to a low output-power semiconductor laser device for improving a self-sustained pulsation characteristic thereof.

Furthermore, the layers in the semiconductor laser device can be deposited using methods other than the above-mentioned MOCVD method. For example, an MBE (molecular beam epitaxy) method, an LPE (liquid phase epitaxy) method, an MO-MBE (Metal Organic-Molecular Beam Epitaxy) method or an ALE (Atomic Layer Epitaxy) method are available.

According to the present invention, a high output-power semiconductor laser device is realized which has an excellent low-noise characteristic and a strong self-sustained pulsation characteristic without experiencing deterioration of an optical characteristic, poor reliability or an increase in an operation current.

Figure 12:
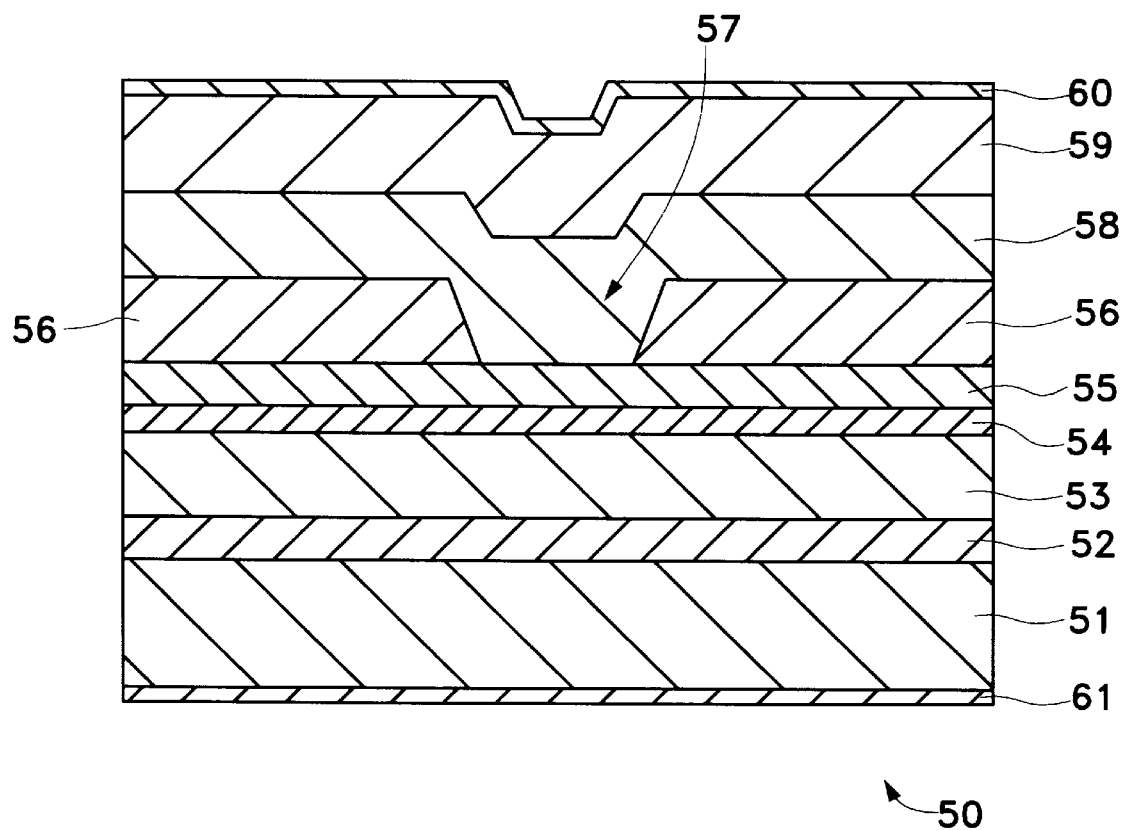
FIG. 12 is a cross-sectional view showing one type of conventional semiconductor laser device.
Figure 13:
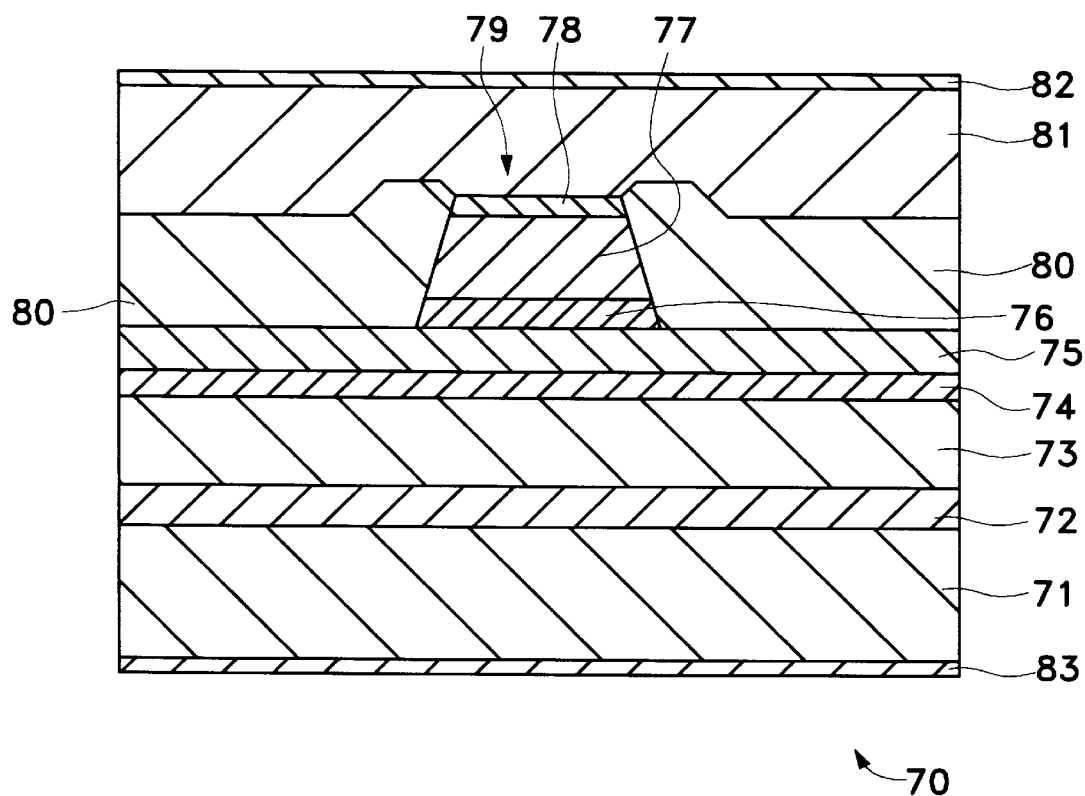
FIG. 13 is a cross-sectional view showing another type of conventional semiconductor laser device.

The semiconductor laser device 50 shown in FIG. 12 (i.e., a conventional semiconductor laser device) has an oscillation starting current of 50 mA, while an operation current of approximately 120 mA is required for obtaining an output of 35 mW. The semiconductor laser device 70 shown in FIG. 13 (i.e., another type of conventional semiconductor laser device) has an oscillation starting current of 50 mA, while an operation current of approximately 90 mA is required for obtaining an output of 35 mW. On the other hand, the semiconductor laser device 100, according to the first example of the present invention, typically has an oscillation starting current of 30 mA, while an operation current of approximately 70 mA is required for obtaining an output of 35 mW. The semiconductor laser device 200, according to the second example of the present invention, typically has an oscillation starting current of 27 mA, while an operation current of approximately 60 mA is required for obtaining an output of 35 mW.

As can be appreciated by comparing the above-mentioned values of the semiconductor laser devices, the semiconductor laser devices according to the present invention exhibit exceedingly improved operation characteristics compared to that of conventional semiconductor laser devices.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device, comprising:
   a semiconductor substrate of a first conductivity type;
   a layered structure including at least a first cladding layer of the first conductivity type, an active layer, and a second cladding layer of a second conductivity type, the layered structure being provided on the semiconductor substrate;
   a current blocking structure, having a striped concave portion therein, formed on the layered structure; and
   a third cladding layer of the second conductivity type provided so as to cover the striped concave portion and the current blocking structure,
   wherein the current blocking structure includes at least a saturable absorbing layer having a forbidden band width which is substantially equal to a forbidden band width of the active layer, wherein a forbidden band width of a portion of the current blocking structure other than the saturable absorbing layer is greater than the forbidden band width of the first and second cladding layers so as not to absorb a laser beam generated at the active layer.

2. A semiconductor laser device according to claim 1, wherein the current blocking structure includes an n-type semiconductor layer provided adjacent to the layered structure, and the saturable absorbing layer is provided adjacent to the n-type semiconductor layer such that the n-type semiconductor layer is positioned closer to the substrate than the saturable absorbing layer.

3. A semiconductor laser device according to claim 1, wherein an Al mole fraction x which determines an effective forbidden band width of the active layer and an Al mole fraction y which determines an effective forbidden band width of the saturable absorbing layers satisfy a relationship: $(x-0.02) \leq y \leq (x+0.02)$.

4. A semiconductor laser device, comprising:

a semiconductor substrate of a first conductivity type;

a layered structure including at least a first cladding layer of the first conductivity type, an active layer, and a second cladding layer of a second conductivity type, the layered structure being provided on the semiconductor substrate;

a striped mesa region including at least a third cladding layer of the second conductivity type and a contact layer of the second conductivity type, the striped mesa region being formed on the layered structure; and a current blocking structure provided on the layered structure so as to sandwich the striped mesa region, wherein the current blocking structure includes at least a saturable absorbing layer having a forbidden band width which is substantially equal to a forbidden band width of the active layer, the saturable absorbing layer covering side surfaces of the striped mesa region, and wherein a forbidden band width of a portion of the current blocking structure other than the saturable absorbing layer is greater than the forbidden band width of the first and second cladding layers so as not to absorb a laser beam generated at the active layer.

5. A semiconductor laser device according to claim 4, wherein an Al mole fraction x which determines an effective forbidden band width of the active layer and an Al mole fraction y which determines an effective forbidden band width of the saturable absorbing layers satisfy a relationship: $(x-0.02) \leq y \leq (x+0.02)$.

* * * * *